United States Patent
Fan et al.

(10) Patent No.: US 8,985,345 B2
(45) Date of Patent: Mar. 24, 2015

(54) RACK FOR ELECTRONIC APPARATUS

(71) Applicant: Hon Hai Precision Industry Co., Ltd., New Taipei (TW)

(72) Inventors: Chen-Lu Fan, New Taipei (TW); Li-Ping Chen, New Taipei (TW)

(73) Assignee: Zhongshan Innocloud Intellectual Property Services Co., Ltd., Zhongshan (CN)

( * ) Notice: Subject to any disclaimer, the term of this patent is extended or adjusted under 35 U.S.C. 154(b) by 0 days.

(21) Appl. No.: 13/891,043

(22) Filed: May 9, 2013

(65) Prior Publication Data
US 2014/0076829 A1  Mar. 20, 2014

(30) Foreign Application Priority Data
Sep. 20, 2012 (TW) ............................. 101134503 A

(51) Int. Cl.
| | |
|---|---|
| *A47F 7/00* | (2006.01) |
| *H05K 7/18* | (2006.01) |
| *H05K 7/14* | (2006.01) |
| *H05K 7/16* | (2006.01) |
| *H05K 5/00* | (2006.01) |
| *A47B 81/00* | (2006.01) |

(52) U.S. Cl.
CPC ................ *H05K 7/18* (2013.01); *H05K 7/1488* (2013.01)
USPC ........... 211/26; 361/725; 361/730; 312/223.1

(58) Field of Classification Search
USPC ............. 211/26, 26.2; 248/685; 298.1, 316.8; 361/724–727, 730–732, 666; 312/223.1, 351.1, 351.11, 351.12
See application file for complete search history.

(56) References Cited

U.S. PATENT DOCUMENTS

| | | | | |
|---|---|---|---|---|
| 4,372,632 | A * | 2/1983 | Villa et al. | 312/311 |
| 4,836,624 | A * | 6/1989 | Schwickrath | 312/216 |
| 5,211,459 | A * | 5/1993 | Wu | 312/223.2 |
| RE35,915 | E * | 10/1998 | Hastings et al. | 439/377 |
| 6,857,711 | B1 * | 2/2005 | Straus | 312/205 |
| 7,187,554 | B2 * | 3/2007 | Seki et al. | 361/727 |
| 7,478,890 | B2 * | 1/2009 | Hudz et al. | 312/265.4 |
| 7,599,195 | B2 * | 10/2009 | Chen | 361/810 |
| 8,240,685 | B2 * | 8/2012 | Fan | 280/79.11 |
| 8,254,106 | B2 * | 8/2012 | Lin et al. | 361/679.33 |
| 8,292,309 | B2 * | 10/2012 | Fan et al. | 280/43.14 |
| 8,295,053 | B2 * | 10/2012 | Fujikawa et al. | 361/752 |
| 8,336,719 | B2 * | 12/2012 | Fan | 211/26 |
| 8,376,479 | B2 * | 2/2013 | Furey et al. | 312/265.4 |
| 8,379,388 | B2 * | 2/2013 | Chen et al. | 361/695 |
| 8,387,933 | B2 * | 3/2013 | Yu et al. | 248/220.22 |
| 8,544,860 | B2 * | 10/2013 | Fan | 280/79.3 |
| 2004/0174105 | A1 * | 9/2004 | Hung | 312/351.1 |
| 2005/0168954 | A1 * | 8/2005 | Kim | 361/725 |
| 2008/0110905 | A1 * | 5/2008 | Cowie et al. | 220/636 |

(Continued)

*Primary Examiner* — Joshua J Michener
*Assistant Examiner* — Devin Barnett
(74) *Attorney, Agent, or Firm* — Novak Druce Connolly Bove + Quigg LLP

(57) ABSTRACT

A rack includes a rack body, at least one latch member secured to the rack body, and a supporting assembly. The supporting assembly includes at least one sliding lever and a supporting member secured to the at least one sliding lever. The at least one sliding lever is slidably engaged in the at least one latch member and the supporting assembly is extendable and retractable relative to the rack body, to provide a wider base for the rack when required where it rests on the floor, increasing stability and decreasing the likelihood that the rack might topple.

20 Claims, 5 Drawing Sheets

(56) References Cited

U.S. PATENT DOCUMENTS

| | | | |
|---|---|---|---|
| 2009/0251038 A1* | 10/2009 | Yu et al. | 312/351.1 |
| 2010/0245710 A1* | 9/2010 | Kim | 349/58 |
| 2012/0013092 A1* | 1/2012 | Fan | 280/79.3 |
| 2012/0097623 A1* | 4/2012 | Zhang et al. | 211/26 |
| 2013/0319961 A1* | 12/2013 | Sun | 211/26 |
| 2013/0341293 A1* | 12/2013 | Peng et al. | 211/26 |
| 2014/0008313 A1* | 1/2014 | Chen | 211/26 |
| 2014/0049920 A1* | 2/2014 | Sloey et al. | 361/727 |

* cited by examiner

RACK FOR ELECTRONIC APPARATUS

BACKGROUND

1. Technical Field

The present disclosure relates to racks, and particularly to a rack for an electronic apparatus.

2. Description of Related Art

Computer systems are made up of many separate computer units or servers, which can be positioned and stacked in a rack. The rack only includes a plurality of support columns located on a bottom portion of the rack to support the rack. However, if the rack is very tall and heavy, the rack can be unstable or even dangerous.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
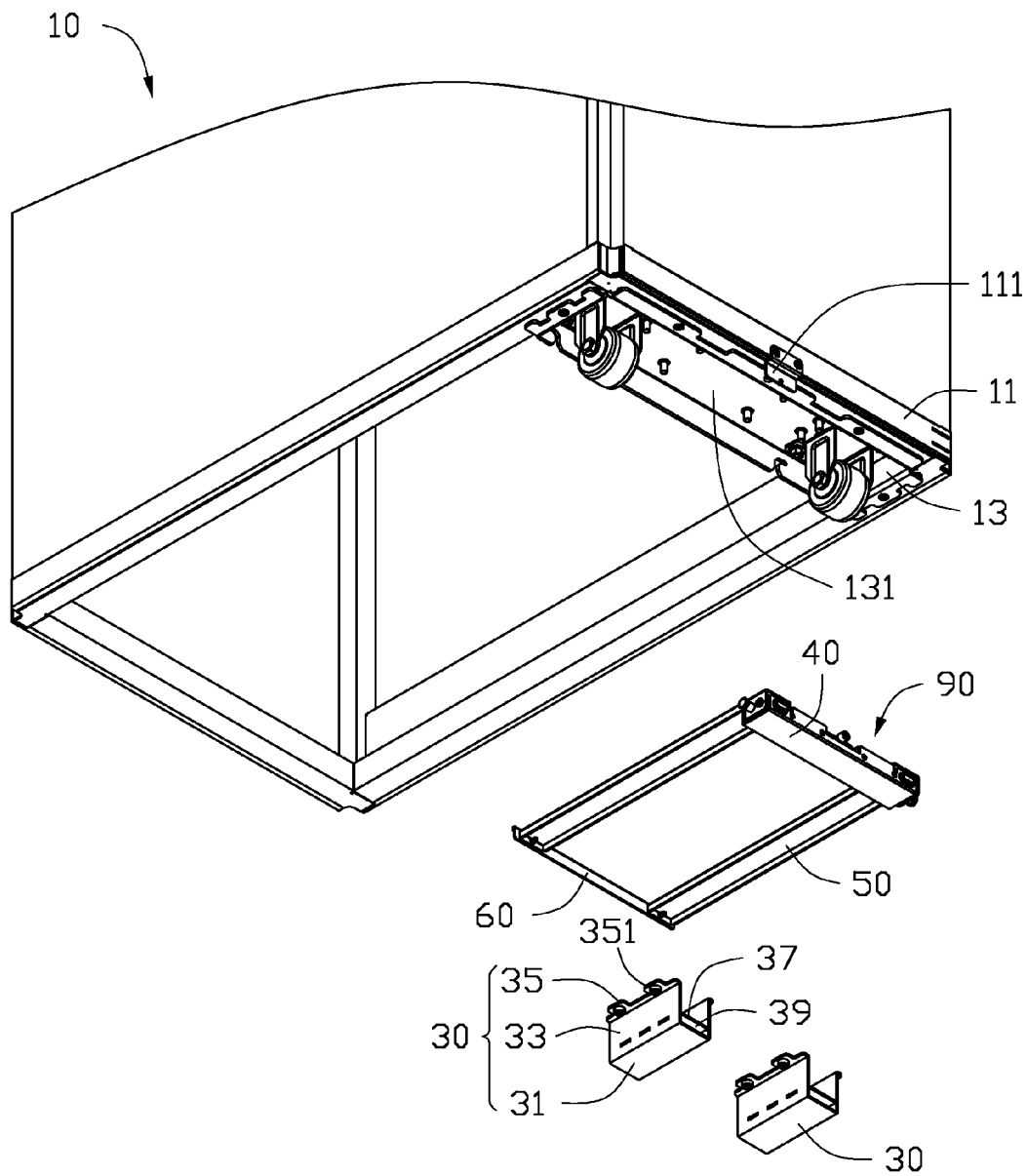
FIG. 1 is an isometric and exploded view of a rack in accordance with one embodiment.
Figure 2:
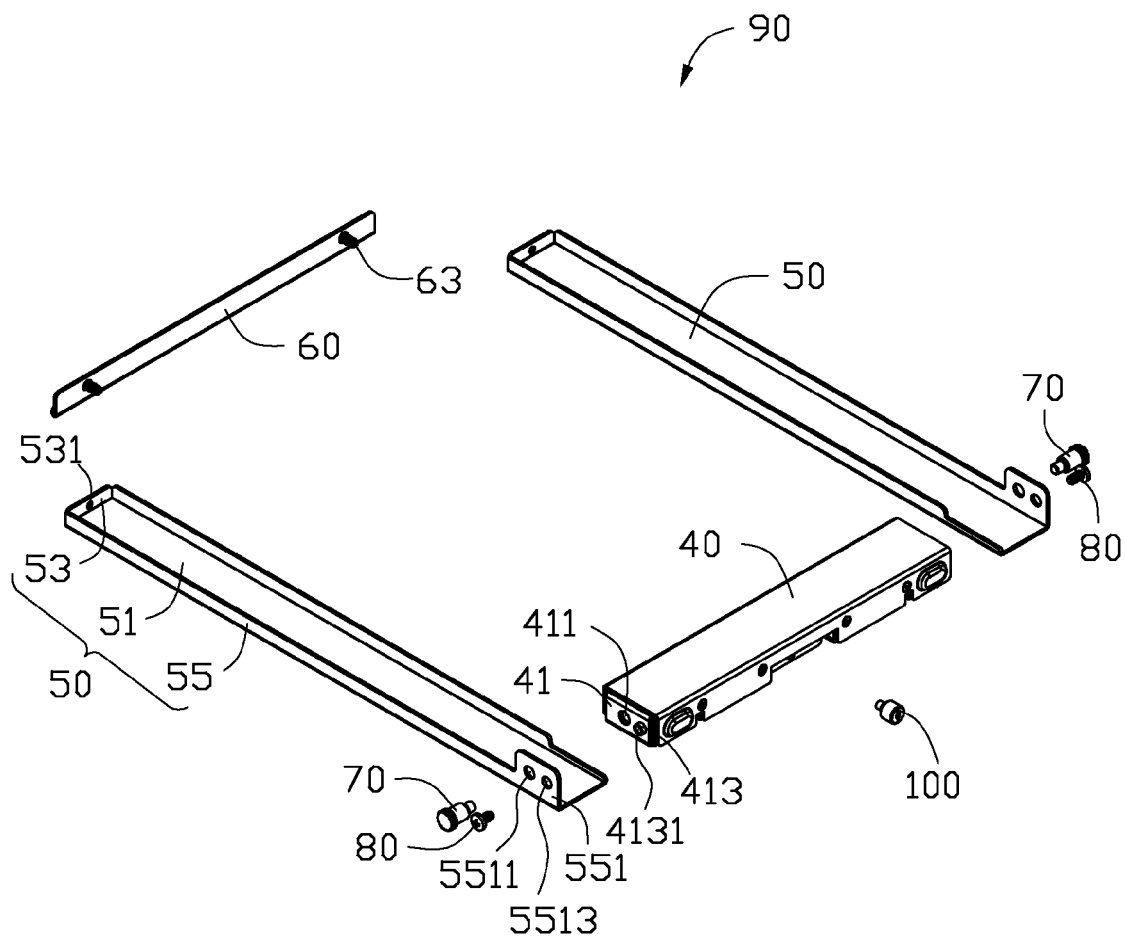
FIG. 2 is isometric view of a supporting assembly of FIG. 1.

FIGS. 1 and 2 illustrate a rack in accordance with an embodiment. The rack includes a rack body 10, two latch members 30 secured to the rack body 10, and a supporting assembly 90. In one embodiment, the rack is configured to receive electronic devices therein, such as servers.

The rack body 10 includes a bottom frame 11. In one embodiment, the rack body 10 is substantially cubic. A stopping piece 111 is secured to a sidewall of the bottom frame 11. A stopping hole 1111 is defined in the stopping piece 111, for securing the supporting assembly 90. An installation member 13, secured to the bottom frame 11, is adjacent to the stopping piece 111.

Each of the two latch members 30 includes a resisting piece 31, two clipping pieces 33, two fixing tabs 35, and a dividing piece 37. The resisting piece 31, the two clipping pieces 33, the two fixing tabs 35, and the dividing piece 37 cooperatively define a sliding cavity 39, for receiving the supporting assembly 90. The two clipping pieces 33 extend upwards from opposite sides of the resisting piece 31. The two clipping pieces 33 are substantially parallel to each other and perpendicular to the resisting piece 31. The two fixing tabs 35 extend outwards from the two clipping pieces 33. Each of the two fixing tabs 35 defines two securing holes 351. The dividing piece 37 is clipped between the two clipping pieces 33 and is substantially parallel to the resisting piece 31.

Figure 3:
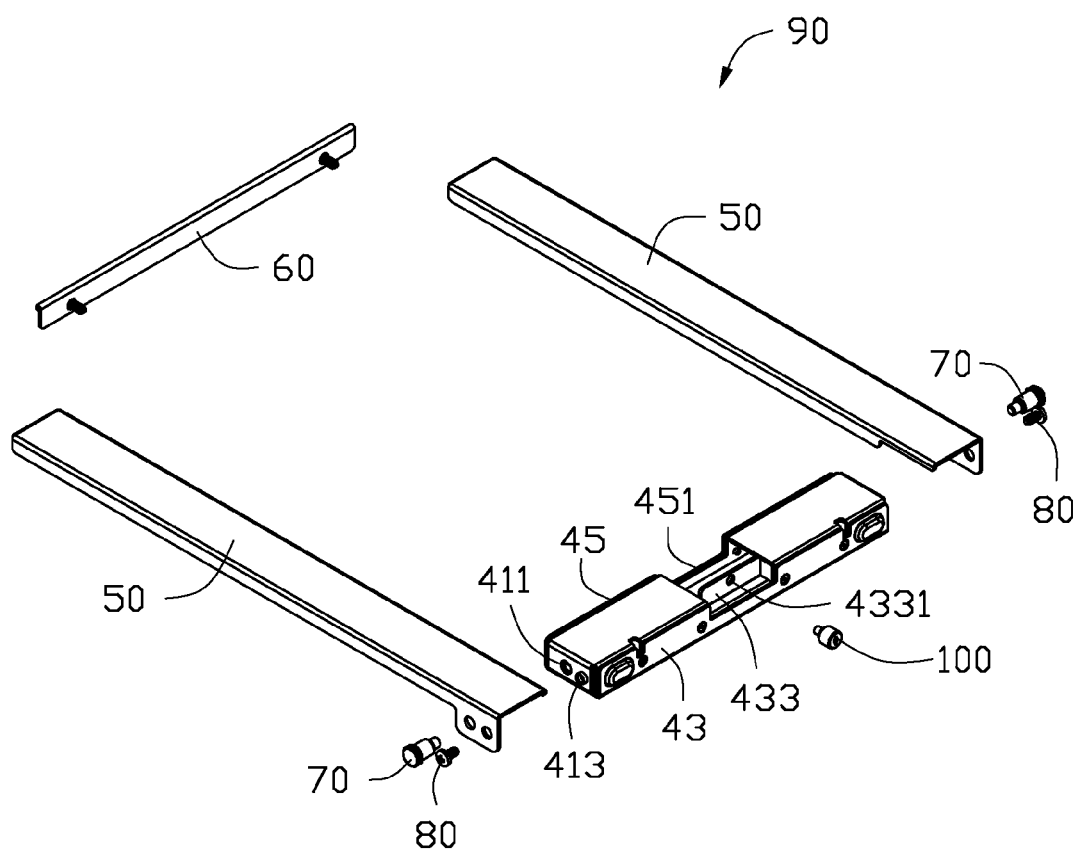
FIG. 3 is similar to FIG. 2, but viewed from a different aspect.

Referring to FIGS. 2-3, the supporting assembly 90 includes a supporting member 40, two sliding levers 50, an elongated blocking plate 60, and two fixing members 70. The supporting member 40 includes a connecting plate 43, two pivot pieces 41, and a supporting plate 45. The two pivot pieces 41 are located on opposite sides of the connecting plate 43 and connect the connecting plate 43 to the supporting plate 45. Each of the two pivot pieces 41 defines a fixing hole 411 corresponding to each fixing member 70. A pivot post 413 with a pivot hole 4131 is located on each of the two pivot pieces 41. A fastening piece 433 extends towards the supporting plate 45 from the connecting plate 43. The fastening piece 433 is substantially L-shaped and defines a fastening hole 4331. The supporting plate 45 is substantially parallel to the connecting plate 43 and defines a cutout 451 corresponding to the fastening piece 433. Two protrusions 453 are located on outer surface of the supporting plate 45, for standing on a ground.

Each of the two sliding levers 50 includes a sliding plate 51, a mounting tab 53, and a flange 55. The mounting tab 53 and the flange 55 extend from adjacent sides of the sliding plate 51. The mounting tab 53 defines a mounting hole 531, and two engaging members 63 are located on the blocking plate 60, corresponding to each mounting hole 531. The two engaging members 63 are screwed into each mounting hole 531, to secure the blocking plate 60 to the two sliding levers 50. The flange 55 defines a through hole 5511 corresponding to the fixing hole 411 on a corner of the flange 55. A rotating hole 5513, adjacent to the through hole 5511, is defined in the flange 55, corresponding to the pivot post 413.

Figure 4:
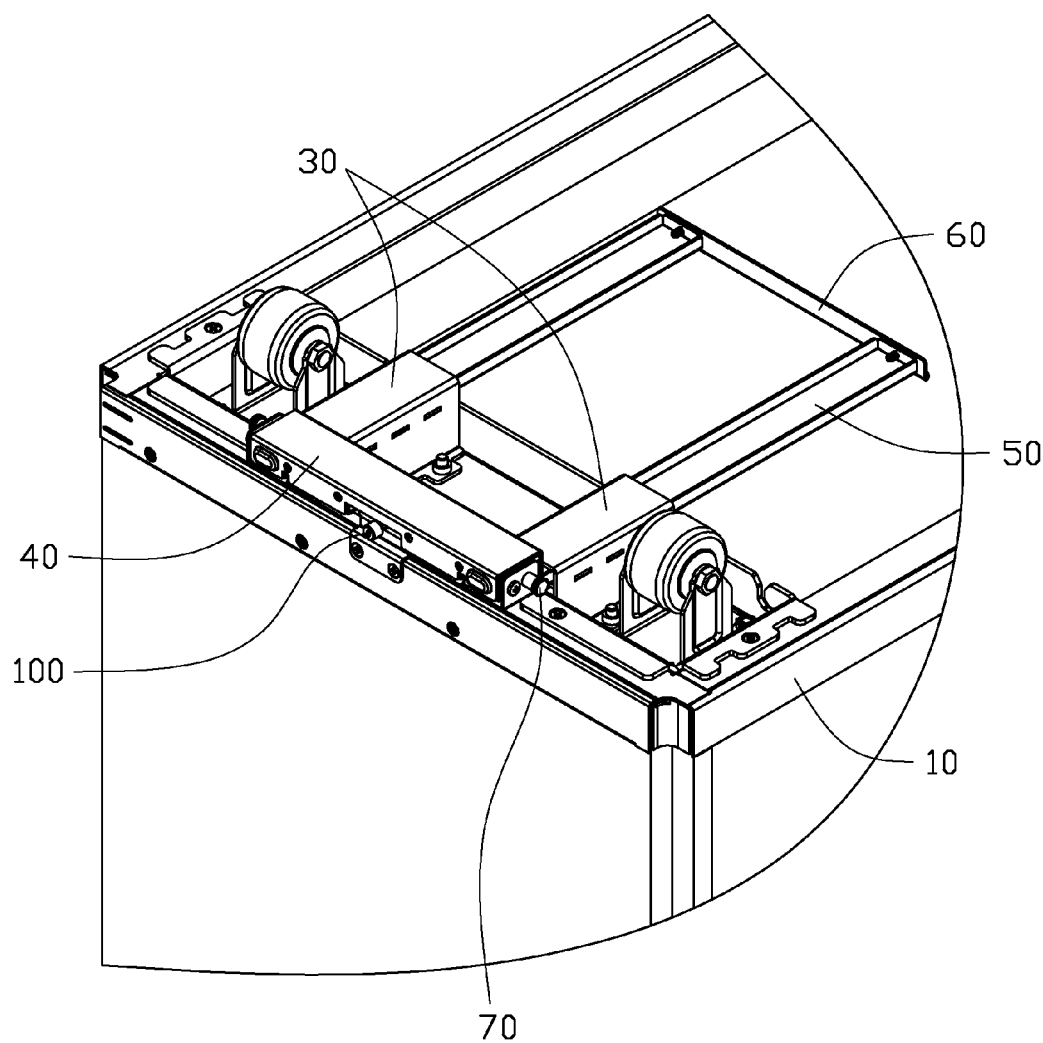
FIG. 4 is an assembled view of the rack of FIG. 1, the supporting assembly is located in the first position.

Referring to FIG. 4, in assembly, the two latch members 30 are secured to the installation member 13. Two locking members 80 extend through each rotating hole 5513 and each pivot hole 4131, to secure the supporting member 40 between one end of the two sliding levers 50. The other ends of each of the two sliding levers 50 are inserted into each sliding cavity 39 of the two latch members 30. The blocking plate 60 is secured to the other ends of the two sliding levers 50.

The supporting member 40 is pulled out along a first direction to slide the two sliding levers 50, until the supporting assembly 90 is moved to a first position, where the blocking plate 60 is engaged with the two latch members 30, and the supporting member 40 is disengaged from the rack body 10. The supporting member 40 is rotatable around the two locking member 80 relative to the two sliding levers 50, until the two protrusions 453 abut the ground to provide additional support the rack body 10, increasing stability and preventing the rack body 10 from toppling.

Figure 5:
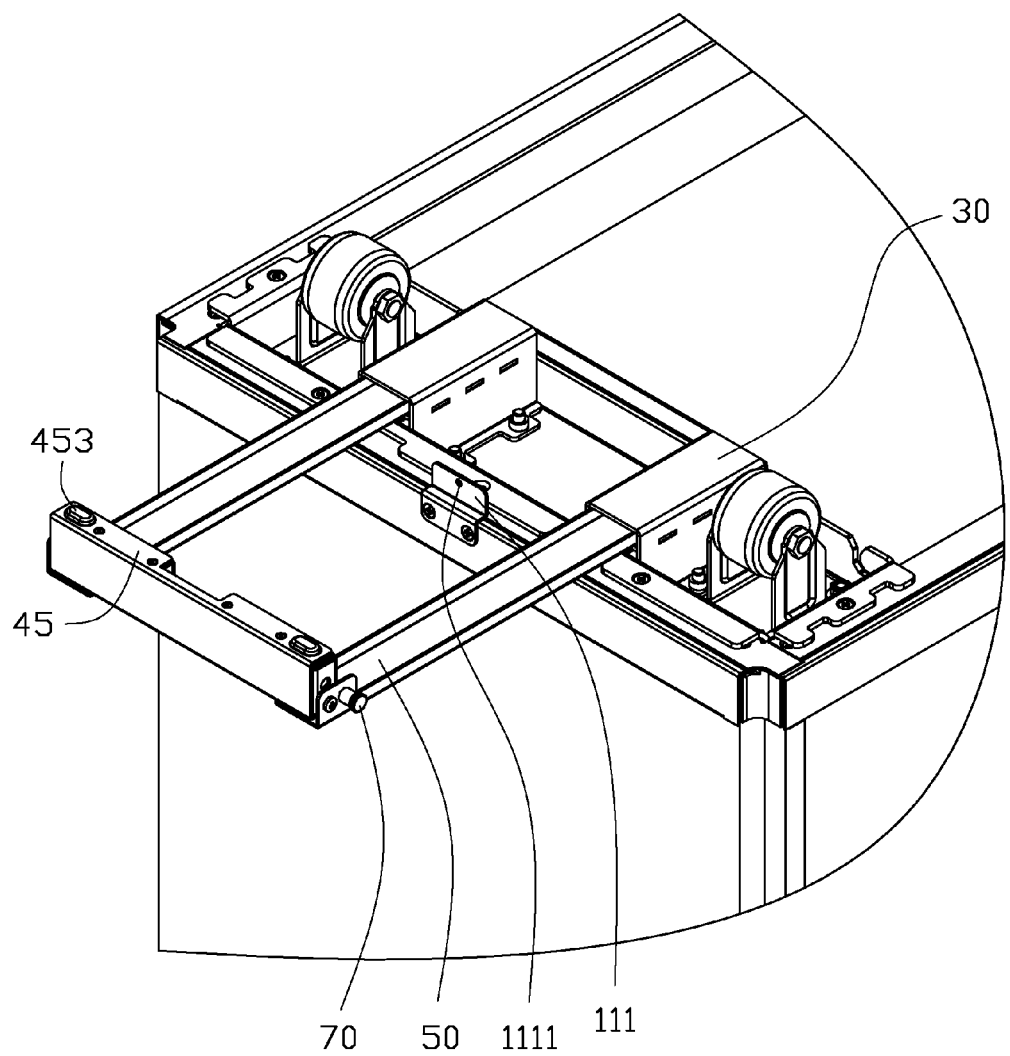
FIG. 5 is another assembled view of the rack of FIG. 1, the supporting assembly is located in the second position.

Referring to FIG. 5, to retract the supporting assembly 90, the supporting member 40 is rotated until each fixing hole 411 is aligned with each through hole 5511, and each fixing member 70 extends through the through hole 5511 to be locked into the fixing hole 411, preventing the supporting member 40 from rotating relative to the sliding levers. The supporting member 40 is pushed in along a second direction opposite to the first direction. The supporting assembly 90 is then located in a second position, where the blocking plate 60 is disengaged from each of the two latch members 30, and the stopping piece 111 extends through the cutout 451 to abut the fastening piece 433, to align the stopping hole 1111 with the fastening hole 4331. A thumb screw 100 can be used to secure the supporting assembly 90 to the rack body 10, to retain the supporting assembly 90 in the retracted state, by extending into the fastening hole 4331 and the stopping hole 1311.

It is to be understood however that even though numerous characteristics and advantages of the embodiments have been set forth in the foregoing description, together with details of the structure and function of the embodiments, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. A rack for storing electronic devices, comprising:
a rack body comprising a plurality of sidewalls, a bottom frame secured to the sidewalls, and a stopping piece being attached to and extending downwardly from the bottom frame;
at least one latch member secured to and extending downwardly from the bottom frame of the rack body; and
a supporting assembly comprising at least one sliding lever and a supporting member secured to the at least one sliding lever, and the at least one sliding lever being slidably engaged in the at least one latch member, wherein the supporting assembly is extendable and retractable relative to the stopping piece and the rack body between a first position and a second position via the at least one sliding lever; in the first position, the supporting member extends out from the rack body and is spaced apart from the stopping member wherein in the first position, the supporting member is rotatable relative to the at least one sliding lever between a horizontal position and a vertical position to provide a wider base for the rack when the rack body rests on a floor in order to increase the stability of the rack and decrease the likelihood that the rack might topple; and in the second position, the supporting member is retracted underneath the rack body and the supporting member is secured to the stopping piece.

2. The rack of claim 1, wherein the supporting assembly comprises a blocking plate secured to the at least one sliding lever opposite to the supporting member; when the supporting assembly is located in the first position, the blocking plate is engaged with the at least one latch member; and when the supporting assembly is located in the second position, the blocking plate is disengaged from the at least one latch member.

3. The rack of claim 2, wherein the at least one sliding lever comprises two sliding levers, the at least one latch member comprises two latch members, and each of the sliding levers is slidably engaged in a corresponding latch member.

4. The rack of claim 3, wherein the supporting member comprises a fastening piece, when the supporting assembly is located in the first position, the fastening piece is disengaged from the stopping piece; and when the supporting assembly is located in the second position, the fastening piece abuts the stopping piece.

5. The rack of claim 4, wherein the supporting member further comprises two pivot pieces, each of the two sliding levers comprises a flange, and each of the pivot pieces is rotatably secured to a corresponding flange.

6. The rack of claim 5, wherein the supporting assembly further comprises two fixing members, each flange defines a through hole, each of the two pivot pieces defines a pivot hole; when the supporting assembly is located in the second position, each fixing member extends through a corresponding through hole to be locked into a respective pivot hole in order to prevent the supporting member from rotating relative to the two sliding levers; and when the supporting assembly is located in the first position, each fixing member is disengaged from the respective pivot holes, and the supporting member is rotatable relative to the two sliding levers, to support the rack body.

7. The rack of claim 5, wherein the supporting member further comprises a connecting plate, the two pivot pieces are located on two opposite sides of the connecting plate, and the fastening piece is located on the connecting plate.

8. The rack of claim 7, wherein the supporting member further comprises a supporting plate, and two protrusions are located on the supporting plate, wherein the protrusions rest upon the floor when the supporting member is in the vertical position.

9. The rack of claim 3, wherein each of the two sliding levers comprises a sliding plate, each of the two latch members defines a sliding cavity, and each sliding plate is engaged in a corresponding sliding cavity.

10. The rack of claim 9, wherein each of the two latch members comprises a resisting piece, two clipping pieces and a dividing piece; wherein the resisting piece, the two clipping pieces and the dividing piece cooperatively define each sliding cavity.

11. A rack for storing electronic devices, comprising: a rack body comprising a plurality of sidewalls, a bottom frame secured to the sidewalls, and a stopping piece attached to and extending downwardly from the bottom frame; two latch members secured to and extending downwardly from the bottom frame of the rack body; and a supporting assembly comprising two sliding levers, a blocking plate, and a supporting member, each of the two sliding levers being slidably engaged in each of the two latch members, the blocking plate and the supporting member being secured to opposite ends of the two sliding levers, wherein the supporting assembly is extendable and retractable relative to the rack body between a first position and a second position via the two sliding levers; in the first position, the supporting member extends out from the rack body and is spaced apart from the stopping member wherein in the first position, the supporting member is rotatable relative to the two sliding levers between a horizontal position and a vertical position to provide a wider base for the rack when the rack body rests on a floor in order to increase the stability of the rack and decrease the likelihood that the rack might topple, and the blocking plate abuts the two latch members; and in the second position, the supporting member is retracted underneath the rack body and secured to the stopping piece, and the blocking plate is spaced apart from the two latch members.

12. The rack of claim 11, wherein the supporting member comprises a fastening piece, when the supporting assembly is located in the first position, the fastening piece is disengaged from the stopping piece; and when the supporting assembly is located in the second position, the fastening piece abuts the stopping piece.

13. The rack of claim 12, wherein the supporting member further comprises two pivot pieces, each of the two sliding levers comprises a flange, and each of the two pivot pieces is pivotably secured to a corresponding flange.

14. The rack of claim 13, wherein the supporting assembly further comprises two fixing members, each flange defines a through hole, each of the two pivot pieces defines a pivot hole; when the supporting assembly is located in the second position, each fixing member extends through a corresponding through hole to be locked into a respective pivot hole in order to prevent the supporting member from rotating relative to the two sliding levers; when the supporting assembly is located in the first position, each fixing member is disengaged from the respective pivot holes, and the supporting member is rotatable relative to the two sliding levers to support the rack body.

15. The rack of claim 14, wherein the supporting member further comprises a connecting plate, and the two pivot pieces are located on two opposite sides of the connecting plate, and the fastening piece is located on the connecting plate.

16. The rack of claim 15, wherein the supporting member further comprises a supporting plate, and the two pivot pieces connect the connecting plate to the supporting plate.

17. The rack of claim 16, wherein two protrusions are located on the supporting plate, when the supporting assembly is located in the first position, the two protrusions stand on the floor to support the rack body; and when the supporting assembly is located in the second position, the two protrusions are configured to disengage from the floor.

18. The rack of claim 11, wherein each of the two sliding levers comprises a sliding plate, each of the two latch members defines a sliding cavity, and each sliding plate is engaged in a corresponding sliding cavity.

19. The rack of claim 18, wherein each of the two latch members comprises a resisting piece, two clipping pieces and a dividing piece; wherein the resisting piece, the two clipping pieces and the dividing piece cooperatively define each sliding cavity.

20. A rack, comprising: a rack body; two latch members secured to the rack body; and a supporting assembly comprising two sliding levers, a blocking plate, and a supporting member, each of the two sliding levers being slidably engaged in a corresponding latch member, the blocking plate and the supporting member being secured to opposite ends of the two sliding levers, wherein the supporting assembly is extendable and retractable relative to the rack body between a first position and a second position; in the first position, the supporting member extends out from the rack body to provide a wider base for the rack when the rack body rests on a floor, wherein the supporting member is rotatable relative to the two sliding levers, and the blocking plate abuts the two latch members; and in the second position, the supporting member is retracted underneath the rack body, and the blocking plate is spaced apart from the two latch members;

the supporting member comprises a fastening piece; a stopping piece is located on the rack body; when the supporting assembly is located in the first position, the fastening piece is disengaged from the stopping piece; and when the supporting assembly is located in the second position, the fastening piece abuts the stopping piece;

the supporting member further comprises two pivot pieces, each of the two sliding levers comprises a flange, and each of the pivot pieces is pivotably secured to a corresponding flange; and the supporting assembly further comprises two fixing members, each flange defines a through hole, each of the two pivot pieces defines a pivot hole; when the supporting assembly is located in the second position, each fixing member extends through a corresponding through hole to be locked into a respective pivot hole to prevent the supporting member from rotating relative to the two sliding levers; when the supporting assembly is located in the first position, each fixing member is disengaged from the respective pivot hole, and the supporting member is rotatable relative to the two sliding levers to support the rack body.

* * * * *